United States Patent [19]

Iwasa

[11] Patent Number: 5,278,787
[45] Date of Patent: Jan. 11, 1994

[54] SEMICONDUCTOR DEVICE AND METHOD OF MANUFACTURING THE SAME

[75] Inventor: Shoichi Iwasa, Sagamihara, Japan

[73] Assignee: Nippon Steel Corporation, Tokyo, Japan

[21] Appl. No.: 989,632

[22] Filed: Dec. 11, 1992

[30] Foreign Application Priority Data

Dec. 13, 1991 [JP] Japan .................. 3-330338

[51] Int. Cl.$^5$ ............................................ H01L 21/22
[52] U.S. Cl. ............................ 365/185; 257/335; 257/345
[58] Field of Search ............... 257/221, 335, 336, 314, 257/315, 316, 317, 344, 345; 365/185; 437/16, 30, 154, 45, 52, 148, 158

[56] References Cited

U.S. PATENT DOCUMENTS

| | | | |
|---|---|---|---|
| 4,868,619 | 9/1989 | Mukherjee et al. | 257/316 |
| 4,939,558 | 7/1990 | Smayling et al. | 257/316 |
| 4,949,140 | 8/1990 | Tam | 257/316 |
| 4,979,005 | 12/1990 | Mitchell | 257/316 |

FOREIGN PATENT DOCUMENTS

| | | | |
|---|---|---|---|
| 142304 | 6/1978 | Japan | 257/345 |
| 197609 | 3/1988 | Japan | 257/345 |
| 243644 | 4/1988 | Japan | 257/335 |
| 1-170544 | 7/1990 | Japan . | |

OTHER PUBLICATIONS

Yoshikawa et al "16M EPROM cell technique" Nikkei Microdevices Jan. 1990 pp. 94–100.
Umezawa et al "A 5V–Only 0.6 Flash EEPROM with Row Decoder Scheme in Triple-Well Structure" SDM 92-2 pp. 7–11.

*Primary Examiner*—Eugene R. LaRoche
*Assistant Examiner*—Vu A. Le
*Attorney, Agent, or Firm*—Pollock, Vande Sande & Priddy

[57] ABSTRACT

An improved structure of and a method of manufacturing a semiconductor device which comprises a semiconductor substrate of a first conductivity type, a gate region formed on one surface of the substrate and including a first gate insulating film, a first gate electrode, a second gate insulating film and a second gate electrode laminated in that order, source and drain diffusion layers formed on the one surface of the substrate with the gate region disposed between the source and drain diffusion layers, the source and drain diffusion layers having a second conductivity type different from the first conductivity type, and a diffusion layer of the first conductivity type formed in a selected region of the substrate including at least a part of an intermediate region disposed between the source and drain diffusion layers, the diffusion layer of the first conductivity type having an inclined impurity concentration higher than that of the substrate such that the concentration gradually decreases in the direction from the drain diffusion layer toward the source diffusion layer.

13 Claims, 2 Drawing Sheets

SEMICONDUCTOR DEVICE AND METHOD OF MANUFACTURING THE SAME

BACKGROUND OF THE INVENTION

1. Filed of the Invention

The present invention relates to a semiconductor device and more particularly, to a non-volatile MOS semiconductor memory device such as EPROM or flash EPROM and a method of manufacturing the same.

2. Description of the Related Art

As a non-volatile MOS semiconductor device, there are EPROM (ultraviolet erasable and electrically programmable ROM) and flash EEPROM (flash electrically erasable and programmable ROM). In EPROM, data writing is conducted by electrical programming whereas data erasing is conducted by ultraviolet rays. In flash EEPROM, both data writing and data erasing are conducted by electrical programming.

As shown in FIG. 3, an EPROM has a source diffusion layer 22 and a drain diffusion layer 23 formed in a semiconductor substrate 21. Between these layers, the EPROM also has a first gate insulating film 24, a first gate electrode (floating gate) 25, a second gate insulating film 26, and a second gate electrode (control gate) 27. Thus the EPROM has a MOS structure of double-stack gate type. Data writing is conducted by applying a high voltage to the control gate and simultaneously applying a high voltage to the drain so that hot electrons generated in a portion of the channel near the drain are injected into the floating gate thereby to bring the threshold voltage as seen from the control gate into a high state. Data erasing is conducted by irradiating the EPROM by an ultraviolet ray to release electrons contained in the floating gate thereby bringing the threshold voltage into a low state. Such an EPROM is disclosed, for example, in Yoshikawa, et al., "16 EPROM cell technique" NIKKEI MICRODEVICES, January 1990, pages 94–100.

There are various different types of flash EEPROMs depending on the data erasing method. As shown in FIG. 4, one type has a structure almost the same as that of the above described EPROM. Data are written into this flash EEPROM in the same way as the EPROM. Due to a tunnel effect caused by making the first gate oxide film very thin, data erasing is conducted by applying a high voltage to its source to release electrons from its floating gate to its source diffusion layer. Such a flash EEPROM is disclosed, for example, in Umezawa, et al., "A 5 V-Only 0.6 μm Flash EEPROM with ROW Decoder Scheme in Tripple-Well Structure" SDM92-2, ICD92-2, pp. 7–11.

In recent years, the higher integration and higher density have been realized in semiconductor memory devices to make larger the storage capacity thereof. Therefore, there arises a problem such that it takes a long time to write and erase data in EPROM or flash EEPROM. Thus, higher speed of data writing and erasing is demanded.

SUMMARY OF THE INVENTION

An object of the present invention is to provide a semiconductor device such as EPROM and flash EEPROM having an improved hot carrier generation efficiency so that data can be written therein at high speed and a method of manufacturing such a semiconductor device.

In order to achieve the above object, a semiconductor device according to the present invention includes a semiconductor substrate of a first conductivity type, a gate region formed on one surface of the substrate and including a first gate insulating film, a first gate electrode, a second gate insulating film and a second gate electrode laminated in that order, source and drain diffusion layers formed on the one surface of the substrate with the gate region disposed between the source and drain diffusion layers and having a second conductivity type different from the first conductivity type, and a diffusion layer of the first conductivity type formed in a selected region of the substrate including at least a part of an intermediate region between the source and drain diffusion layers, the diffusion layer of the first conductivity type having an impurity concentration which is higher than that of the substrate and varies such that the concentration gradually decreases in a direction from the drain diffusion layer toward the source diffusion layer.

Furthermore, a method of manufacturing a semiconductor device having a source region, a drain region, and a gate region disposed between the source and drain regions according to the present invention includes the steps of forming a gate region including a first gate insulating film, a first gate electrode, a second gate insulating film and a second gate electrode laminated in that order on one surface of a semiconductor substrate of a first conductivity type, forming a diffusion layer of the first conductivity type in a selected region of the substrate including at least a part of an intermediate region disposed between first and second regions where the source and drain are to be formed, and having an impurity concentration which is higher than that of the substrate and varies such that the concentration gradually decreases in a direction from the first region toward the second region, and forming, on the surface of the substrate, a source diffusion layer and a drain diffusion layer, each having a second conductivity type different from the first conductivity type with the gate region disposed between the source and drain diffusion layers.

The semiconductor device according to the present invention is a MOS semiconductor device of double-stack gate type and includes a composite gate region having a first gate insulating film, a first gate electrode, a second gate insulating film and a second gate electrode laminated in that order on one surface of a semiconductor substrate of a first conductivity type. The semiconductor device further includes source and drain diffusion layers of a second conductivity type different from the first conductivity type and formed on the one surface of the substrate wich the gate region disposed between them. Furthermore, the semiconductor device has a diffusion layer of the first conductivity type formed in a selected region of the substrate including at least a part of an intermediate channel region disposed between the source and drain diffusion layers, and having an impurity concentration which is higher than that of the substrate and varies such that the concentration gradually decreases in a direction from the drain diffusion layer toward the source diffusion layer. Therefore, the impurity concentration becomes higher in the direction from the source toward the drain (i.e. the channel direction). Accordingly, the electric field strength becomes higher in the vicinity of the drain so that the efficiency in generation of hot electrons is improved thereby allowing data to be written therein at high speed.

Further, since a low-concentration region of the diffusion layer having an inclined impurity concentration is joined to the source, the breakdown voltage at the junction of the source side becomes higher than that of the drain side. In case of the flash EEPROM, therefore, a high voltage can be applied. Thus the semiconductor device according to the present invention is advantageous in data erasing.

JP-A-2-170544 discloses a diffusion layer formed in a region just under the gate and having an impurity concentration which gradually decreases in the direction from the drain side toward the source side, in order to weaken the electric field strength in the vicinity of the drain thereby obtaining high mutual conductance for the purpose of high speed data writing in ICs. According to this conventional technique, impurities of the same conductivity as that of the drain diffusion region and a large diffusion coefficient are diffused from the drain side, and a diffusion layer having an impurity concentration which gradually decreases in the direction from the drain side toward the source side is formed in a region just under the gate. In this diffusion layer having the inclined impurity concentration, however, impurities of the same conductivity as that of the drain region are diffused so that unlike the present invention utilizing a diffusion layer having an inclined impurity concentration formed by diffusing impurities of a conductivity type different from that of the drain region (the same conductivity type as that of the substrate), the effects of making higher the electric field strength in the vicinity of the drain and enhancing the hot carrier generation efficiency are not obtained.

DESCRIPTION OF THE PREFERRED EMBODIMENTS

An EPROM semiconductor device according to one embodiment of the present invention will now be described by referring to FIGS. 1A to 1C.

Figure 1A:
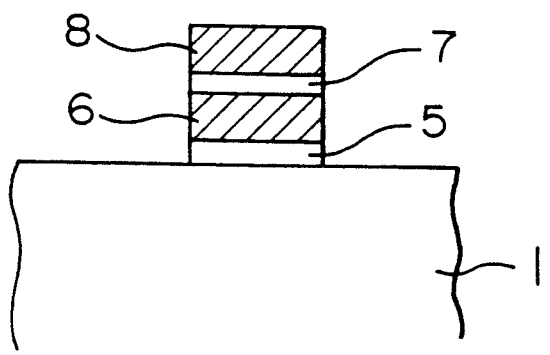
FIGS. 1A, 1B and 1C are schematic sectional views of products at the respective steps in manufacturing a semiconductor device according to one embodiment of the present invention.

First of all, a first gate insulating film 5, a first gate electrode 6, a second gate insulating film 7, and a second gate electrode 8 are laminated in that order on a semiconductor substrate 1, of P-conductivity type for example, as shown in FIG. 1A. Each of the first gate insulating film and the second gate insulating film may be any of a silicon oxide film, a silicon nitride film, and a lamination film of a silicon oxide film and a silicon nitride film. Its thickness is approximately 20 nm in case of EPROM, for example. In case of flash EEPROM, the first gate insulating film is approximately 10 nm thick. Furthermore, the first gate electrode and the second gate electrode are made of polysilicon, for example.

Figure 1B:
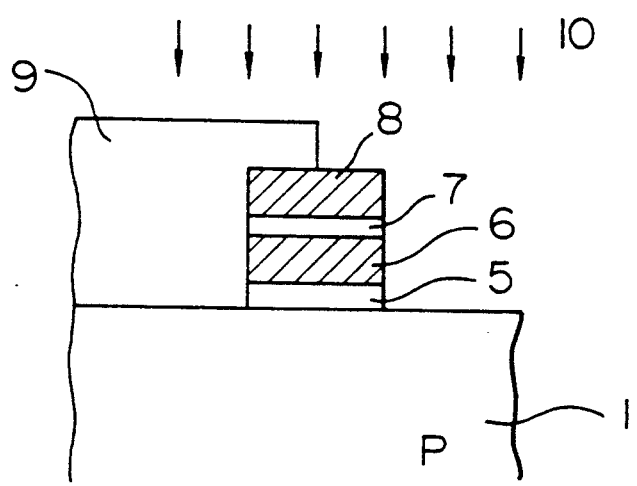
Figure 1C:
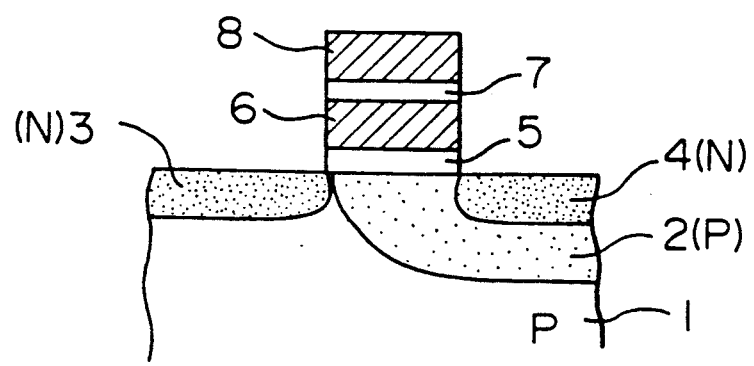

Then, a resist 9 is applied by photolithography to mask the source side, and selective ion implantation of, for example, boron 10 is performed into the drain side as shown in FIG. 1B. Thereafter, the resist is removed and the boron is diffused by drive-in heat treatment at a temperature of 900° to 1000° C., preferably at 950° C. for 10 to 30 minutes, preferably 30 minutes thereby forming the P-type diffusion layer 2 having an inclined impurity concentration such that the concentration gradually decreases from the drain side in the direction toward the source side.

Then, an N-type source diffusion layer 3 and an N-type drain diffusion layer 4 are formed by selective ion implantation of phosphorus or arsenic, for example, with an impurity concentration of about $10^{20-21}$ atoms/cm$^3$. Here, the P-type diffusion layer 2 has an impurity concentration of about $10^{17-18}$ atoms/cm$^3$ in the vicinity of the drain diffusion layer and of about $10^{16}$ atoms/cm$^3$ in the vicinity of the source diffusion layer and generally extends to a depth of about 0.8 μm from the surface of the substrate. Thus, when the drain region has a thickness of about 0.2 to 0.3 μm, the P-type diffusion layer 2 has a thickness of about 0.5 to 0.6 μm. As a result, a cell structure of EPROM as shown in FIG. 1C is obtained.

Figure 2:
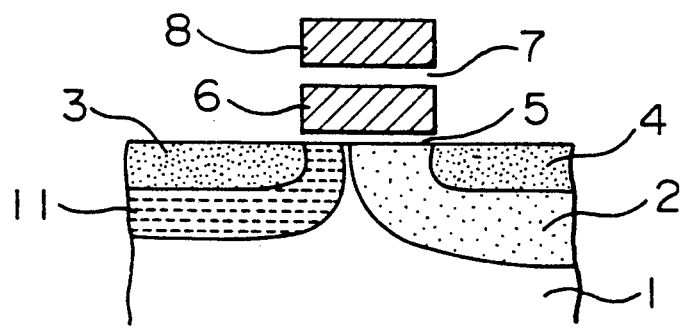
FIG. 2 is a schematic sectional view of a semiconductor device according to another embodiment of the present invention.
Figure 3:
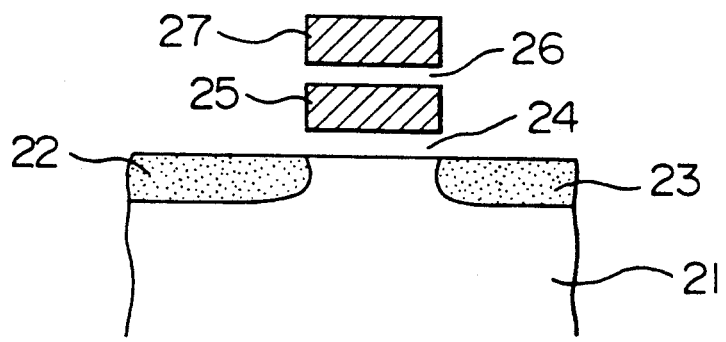
FIG. 3 is a schematic sectional view of a conventional EPROM semiconductor device.
Figure 4:
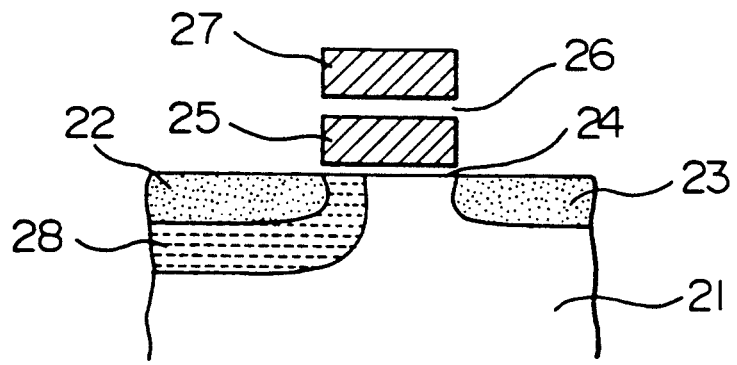
FIG. 4 is a schematic sectional view of a conventional flash EEPROM semiconductor device.

Furthermore, by injecting N-type impurities such as P at a concentration of about $10^{19}$/cm$^3$ to form a thin N-type layer 11 under the source diffusion layer, the flash EEPROM as shown in FIG. 2 can be obtained.

According to the present invention, it is possible to enhance the efficiency of hot electrons generation and increase the data writing speed by forming a P-type diffusion layer having an inclined impurity concentration such that the concentration decreases in the direction from the drain side to the source side. Furthermore, in case of the flash EEPROM, a high voltage can be applied to the source side, which is advantageous for data erasing. Furthermore, it is possible to make the channel length shorter because the breakdown voltage between the source and drain is improved.

I claim:

1. A semiconductor device comprising:
    a semiconductor substrate of a first conductivity type;
    a gate region formed on one surface of said substrate and including a first gate insulating film, a first gate electrode, a second gate insulating film and a second gate electrode laminated in that order;
    spaced source and drain diffusion layers formed on said one surface of said substrate with said gate region disposed between them, each of said source and drain diffusion layers having a second conductivity type different from the first conductivity type; and
    a diffusion layer also of the first conductivity type formed in a selected region of the substrate including at least a part of said one surface of said substrate under said first gate region, said diffusion layer of the first conductivity type having an inclined impurity concentration higher than that of said substrate said inclined impurity concentration gradually decreasing in a direction from said drain diffusion layer toward said source diffusion layer.

2. A semiconductor device according to claim 1, wherein said first conductivity type is a P-type.

3. A semiconductor device according to claim 1, further comprising a second diffusion layer of the second conductivity type formed in said substrate under said source diffusion layer.

4. A semiconductor device according to claim 1, wherein said diffusion layer of the first conductivity type includes boron as impurities for defining its conductivity type.

5. A semiconductor device according to claim 4, wherein the impurity concentration at an area of said diffusion layer of the first conductivity type in a vicinity of said drain region is more than ten times of the impurity concentration at another area thereof in a vicinity of said source region.

6. A method of manufacturing a semiconductor device having a source region, a drain region, and a gate region disposed between said source and drain regions, comprising the steps of:

forming a gate region by laminating a first gate insulating film, a first gate electrode, a second gate insulating film, and a second gate electrode in that order on one surface of a semiconductor substrate of a first conductivity type;

forming a diffusion layer also of the first conductivity type but having a concentration higher than that of said semiconductor substrate, in a selected region of said semiconductor substrate including at least a part of an intermediate region disposed between first and second regions where said drain and source regions are to be formed, said diffusion layer being formed to have an inclined impurity concentration such that the impurity concentration of said diffusion layer gradually decreases in a direction from said first region toward said second region; and forming, at the first and second regions, source and drain diffusion layers of a second conductivity type different from the first conductivity type with said gate region being disposed at said intermediate region between said source and drain diffusion layers.

7. A method for manufacturing a semiconductor device according to claim 6, further comprising the step of forming an impurity diffusion layer of the second conductivity type under said source region of said substrate.

8. A semiconductor device comprising:
a semiconductor substrate of a first conductivity type;
a gate region formed on one surface of said substrate and including a first gate insulating film, a first gate electrode, a second gate insulating film and a second gate electrode laminated in that order;
spaced source and drain diffusion layers formed on said one surface of said substrate with said gate region disposed between them, each of said source and drain diffusion layers having a second conductivity type different from the first conductivity type; and
a diffusion layer also of the first conductivity type, formed in a selected region of the substrate including at least a part of an intermediate region disposed between said source and drain diffusion layers, said diffusion layer of the first conductivity type having an impurity concentration which is higher than that of said substrate and inclined such that the impurity concentration of said diffusion layer gradually decreases in a direction from said drain diffusion layer toward said source diffusion layer;
wherein said diffusion layer of the first conductivity type includes boron as impurities for defining its conductivity type and the impurity concentration at an area of said diffusion layer near to said drain region is more than ten times of the impurity concentration at another area thereof near to said source region.

9. A semiconductor device according to claim 8, further comprising a second diffusion layer of the second conductivity type formed in said semiconductor substrate under said source diffusion layer.

10. A semiconductor device comprising:
a semiconductor substrate of a first conductivity type;
a gate region formed on one surface of said substrate and including a first gate insulating film, a first gate electrode, a second gate insulating film and a second gate electrode laminated in that order;
spaced source and drain diffusion layers formed on said one surface of said substrate with said gate region disposed between them, each of said source and drain diffusion layers having a second conductivity type different from the first conductivity type; and
a diffusion layer also of the first conductivity type formed in a selected region of the substrate including at least a part of an intermediate region disposed between said source and drain diffusion layers at which said gate region is formed, said diffusion layer of the first conductivity type having an inclined impurity concentration higher than that of said substrate such that the impurity concentration of said diffusion layer gradually decreases in a direction from said drain diffusion layer toward said source diffusion layer;
wherein said first conductivity type is a P-type and the impurity concentration at an area of said diffusion layer near to said drain region is more than ten times of the impurity concentration at another are thereof near to said source region.

11. A semiconductor device according to claim 10, further comprising a second diffusion layer of the second conductivity type formed in said semiconductor substrate under said source diffusion layer.

12. A semiconductor device comprising:
a semiconductor substrate of a first conductivity type;
a gate region formed on one surface of said substrate and including a first gate insulating film, a first gate electrode, a second gate insulating film and a second gate electrode laminated in that order;
spaced apart source and drain diffusion layers formed on said one surface of said substrate with said gate region being disposed between them, each of said source and drain diffusion layers having a second conductivity type different from the first conductivity type; and
a diffusion layer also of the first conductivity type formed in a selected region of the substrate including at least a part of an intermediate region disposed between said source and drain diffusion layers and at which said gate region is formed, said diffusion layer of the first conductivity type having an inclined impurity concentration higher than that of said substrate such that the impurity concentration of said diffusion layer gradually decreases in a direction from said drain diffusion layer toward said source diffusion layer;
wherein the impurity concentration at an area of said diffusion layer of the first conductivity type near to said drain region is more than ten times of the impurity concentration at another area thereof near to said source region.

13. A semiconductor device according to claim 12, further comprising a second diffusion layer of the second conductivity type formed in said semiconductor substrate under said source diffusion layer.

* * * * *